United States Patent
Yun

(10) Patent No.: US 7,166,507 B2
(45) Date of Patent: Jan. 23, 2007

(54) SEMICONDUCTOR DEVICE AND METHOD FOR FORMING SAME USING MULTI-LAYERED HARD MASK

(75) Inventor: Cheol-ju Yun, Kyunggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 10/774,081

(22) Filed: Feb. 5, 2004

(65) Prior Publication Data

US 2004/0161918 A1   Aug. 19, 2004

(30) Foreign Application Priority Data

Feb. 13, 2003   (KR) .............. 10-2003-0009140

(51) Int. Cl.
   *H01L 21/8242*   (2006.01)
(52) U.S. Cl. .................. 438/253; 257/E27.016
(58) Field of Classification Search .............. None
   See application file for complete search history.

(56) References Cited

U.S. PATENT DOCUMENTS

| | | | | |
|---|---|---|---|---|
| 6,080,529 A * | 6/2000 | Ye et al. | .......... | 430/318 |
| 6,156,485 A * | 12/2000 | Tang et al. | .......... | 430/313 |
| 6,214,662 B1 * | 4/2001 | Sung et al. | .......... | 438/241 |
| 6,245,669 B1 * | 6/2001 | Fu et al. | .......... | 438/636 |
| 6,268,287 B1 * | 7/2001 | Young et al. | .......... | 438/671 |
| 6,316,348 B1 * | 11/2001 | Fu et al. | .......... | 438/636 |
| 6,518,670 B1 * | 2/2003 | Mandelman et al. | .......... | 257/752 |
| 6,534,389 B1 * | 3/2003 | Ference et al. | .......... | 438/586 |
| 6,607,955 B2 * | 8/2003 | Lee | .......... | 438/256 |
| 6,777,341 B2 * | 8/2004 | Shin et al. | .......... | 438/704 |
| 6,902,998 B2 * | 6/2005 | Lee et al. | .......... | 438/616 |
| 7,056,786 B2 * | 6/2006 | Yun et al. | .......... | 438/253 |
| 2001/0034121 A1 * | 10/2001 | Fu et al. | .......... | 438/636 |
| 2005/0064660 A1 * | 3/2005 | Oh et al. | .......... | 438/239 |

FOREIGN PATENT DOCUMENTS

| | | |
|---|---|---|
| KR | 2002-0046778 | 6/2002 |
| KR | 2004-0061856 | 7/2004 |

OTHER PUBLICATIONS

English language abstract of Korean Publication No. 2002-0046778.
English language abstract of Korean Publication No. 2004-0061856.

* cited by examiner

*Primary Examiner*—Michael Lebentritt
*Assistant Examiner*—Andre' Stevenson
(74) *Attorney, Agent, or Firm*—Marger Johnson & McCollom, P.C.

(57) ABSTRACT

According to some embodiments of the invention, bit lines are formed using a multi-layered hard mask and BC nodes are separated by forming line-type BCs in the same direction of gate lines. Thus, a narrowing of shoulders between the bit lines and the BCs can be prevented, and spacers can be formed of a low k-dielectric silicon oxide, thereby lowering parasitic capacitance.

20 Claims, 15 Drawing Sheets

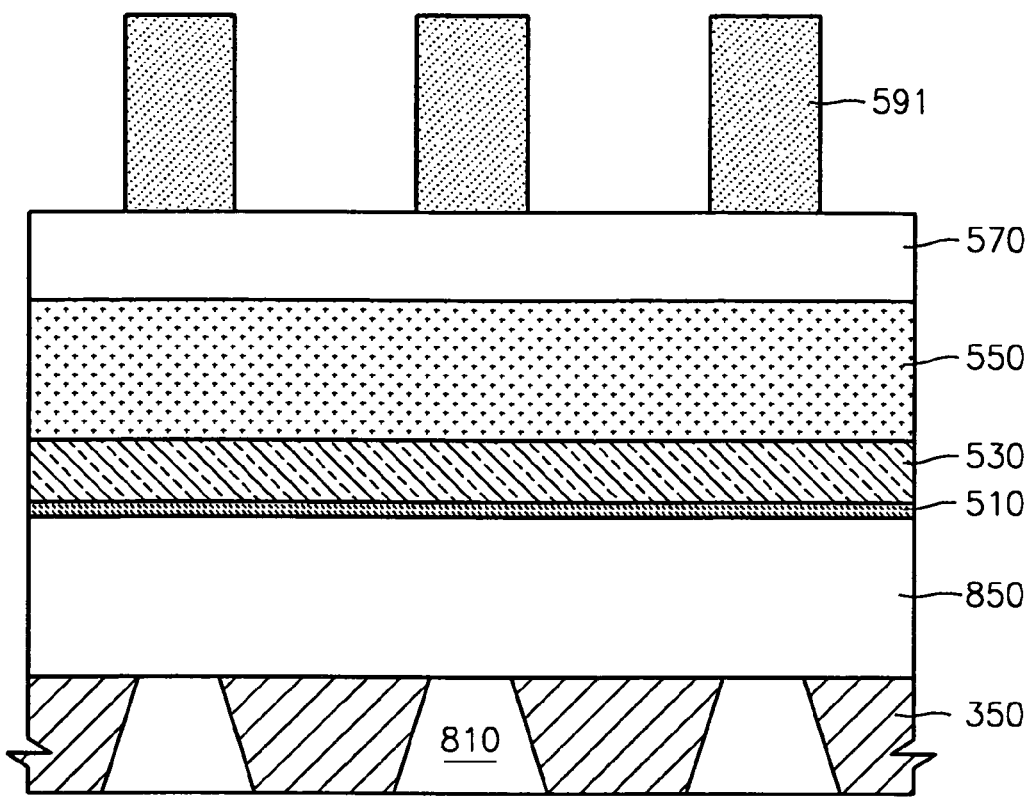
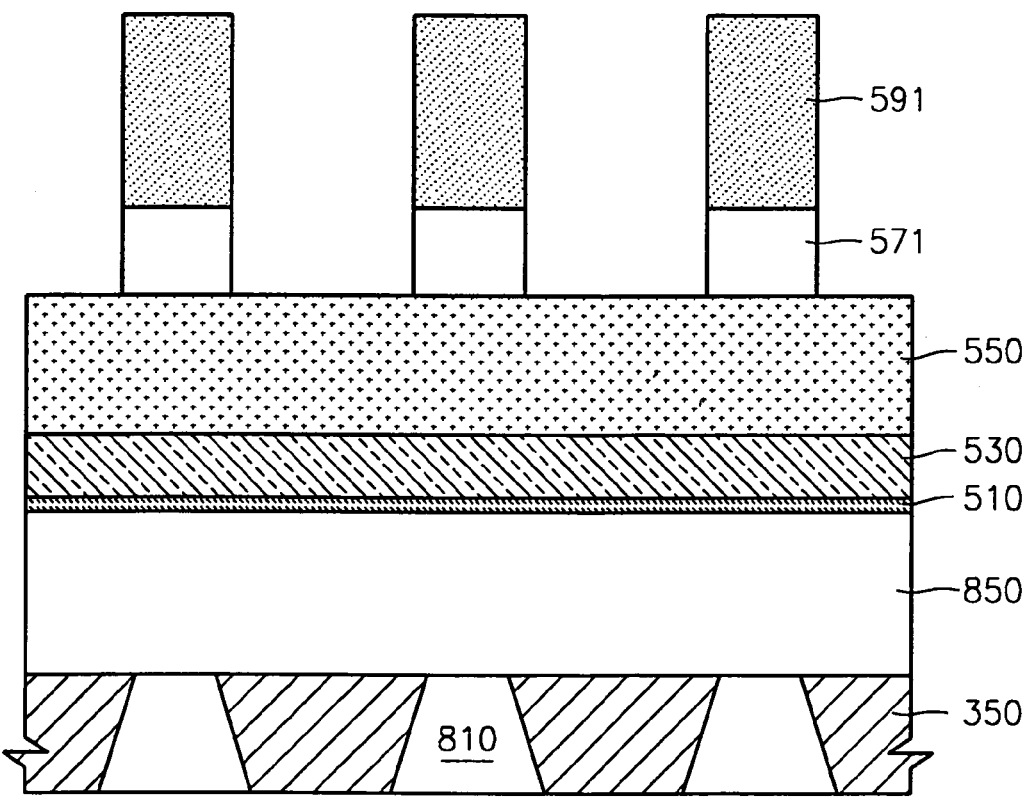

SEMICONDUCTOR DEVICE AND METHOD FOR FORMING SAME USING MULTI-LAYERED HARD MASK

CROSS REFERENCE TO RELATED APPLICATIONS

This application claims priority from Korean Patent Application No. 2003-09140, filed on Feb. 13, 2003, in the Korean Intellectual Property Office, the disclosure of which is incorporated herein by reference in its entirety.

BACKGROUND OF THE INVENTION

1. Field of the Invention

This disclosure relates to a semiconductor device, and more particularly, to a method for forming wire lines such as bit lines and interconnecting contacts such as capacitor contacts by using a multi-layered hard mask.

2. Description of the Related Art

With the improved performance of semiconductor devices (e.g., DRAM devices), design rules have been markedly reduced. The design rule of the semiconductor devices has recently been reduced to about 0.14 µm or less, even to 92 nm or less. Thus, various methods of solving problems caused by a reduction in the design rule during the manufacture of semiconductor devices have been proposed.

Conventionally, wire lines (e.g., word lines or bit lines) of semiconductor devices are typically formed of tungsten silicide ($Wsi_x$). However, to improve the speed and performance of devices for reduced design rules, extensive studies have been made of forming word lines (or gates) and/or bit lines by using tungsten (W) having a relatively low resistance.

FIGS. 1 through 4 are schematic cross-sectional diagrams illustrating a conventional method for forming wire lines.

Referring to FIGS. 1 through 4, bit lines are formed using tungsten. Initially, a barrier layer 21 is formed and then a bit line layer 23 is formed. Here, layers such as a first insulating layer 11 and a second insulating layer 15 are formed on a semiconductor substrate (not shown), and then the barrier layer 21 is formed on the second insulating layer 15. An active device such as a transistor may be formed on the semiconductor substrate, and intermediate interconnecting contacts (e.g., direct contacts (DCs)) (not shown) may be formed to penetrate the second insulating layer 15 so as to electrically connect the transistor and bit lines.

To electrically connect the DCs and the transistor, first contact pads (not shown), which penetrate the first insulating layer 11, may be formed to connect the semiconductor substrate and the DCs. As shown in FIG. 1, second contact pads 17 may be formed on the same level with the first contact pads to electrically connect capacitors and the semiconductor substrate (substantially, the transistor). Capacitor contacts (e.g., buried contacts (BCs)) (not shown) penetrate the second insulating layer 15 between bit lines to be electrically connected to the second contact pads 17. In typical capacitor-over-bit line (COB)-type DRAM devices, the capacitor contacts are electrically connected to the second contact pads 17 and penetrate the second insulating layer 15 between the bit lines such that the capacitors are electrically connected to the semiconductor substrate.

Referring to FIG. 1, after the barrier layer 21 and the bit line layer 23 are formed, a silicon nitride ($Si_3N_4$) mask layer 30 is formed on the bit line layer 23 to form a hard mask, which will be used as an etch mask during patterning. As shown in FIG. 4, the silicon nitride mask layer 30 is formed to a very thick thickness in order to secure sufficient insulating margins 39 between the bit lines 23 and the BCs (not shown) when a contact hole 18 for the BC is formed. For example, the silicon nitride mask layer 30 may be formed to a thick thickness of about 2000 Å. Meanwhile, the insulating margins may be also referred to as "shoulders."

Referring back to FIG. 1, after the layers for forming the bit lines 23 are stacked, a photoresist pattern 40 is formed on the silicon nitride mask layer 30.

Referring to FIG. 2, the bit lines 23 are patterned at once by using the photoresist pattern 40 as an etch mask. Alternatively, the silicon nitride mask layer 30 is first patterned by using the photoresist pattern 40 as an etch mask, and then the photoresist pattern 40 is removed. Thereafter, the bit lines 23 are finally formed by using the patterned silicon nitride mask layer, i.e., a hard mask 35, as a mask.

Referring to FIGS. 3 and 4, after the bit lines 23 are formed, silicon nitride spacers 37 are formed to protect the sidewalls of the bit lines 23. To form the silicon nitride spacers 37, a silicon nitride layer of several hundred Å thickness is formed on the sidewalls and then dry etched using an etchback process. Thereafter, a third insulating layer 19 is formed as an interlayer dielectric (ILD), and BC contact holes (18 of FIG. 4) are formed to connect storage nodes of the capacitors (not shown) with an active region of the semiconductor substrate or with the second contact pads 17 connected to the active region. Here, a dry over-etching is carried out to prevent the BC contact holes 18 from being not-open. Thus, as shown in FIG. 4, the shoulders 39 between the BC contact holes 18 and the bit lines 23 may become very narrow.

If the shoulders 39 become narrow, insulation between the capacitor contacts (i.e., the BCs) and the bit lines 23 is unreliable to reduce breakdown voltage value, thus resulting in a single bit failure. Such a problem may likewise occur in gates using tungsten for wire lines.

Also, due to this bitline to BC shoulder issue, the spacers 37 shown in FIG. 3 should be formed, not of silicon oxide, but of silicon nitride having a relatively high dielectric constant. Also, the thickness of the spacers 37 should be held very thick. This leads to an increase in parasitic capacitance, which may adversely affect the sensing efficiency of DRAMs. Accordingly, advanced methods for forming semiconductor devices are required so as to increase shoulder margin and reduce bit line coupling capacitance.

Embodiments of the invention address these and other disadvantages of the conventional art.

SUMMARY OF THE INVENTION

According to embodiments of the invention, bit lines are formed using a multi-layered hard mask and BC nodes are separated by forming line-type BCs in the same direction of gate lines. Thus, the narrowing of shoulders between the bit lines and the BCs can be prevented, and spacers can be formed of a low k-dielectric silicon oxide, thereby lowering parasitic capacitance.

BRIEF DESCRIPTION OF THE DRAWINGS

The above features and advantages of the invention will become more apparent by describing in detail preferred embodiments thereof with reference to the attached drawings.

FIGS. 12 through 22 are schematic cross-sectional diagrams illustrating a method of forming wire lines and interconnecting contacts according to some embodiments of the invention.

DETAILED DESCRIPTION OF THE INVENTION

In embodiments of the invention, as in COB-type DRAM devices, interconnecting contacts such as capacitor contacts are formed between wire lines such as bit lines. Here, a multi-layered hard mask is used when the bit lines are patterned in order to secure sufficient insulating margins or shoulder margins between the bit lines and the interconnecting contacts. Also, after the bit lines are patterned, while contact holes are being formed to be aligned with the patterned bit lines and penetrate an interlayer dielectric, some layers constituting the multi-layered hard mask can be protected from damage caused by an etching process. Thus, even if the contact holes are formed, the hard mask can remain on the bit lines to a required thickness or more. As a result, sufficient insulating margins can be secured between the capacitor contacts (i.e., BCs) for filling the contact holes and the bit lines. Also, spacers formed for protecting the sidewalls of the bit lines can be formed of silicon oxide having a lower dielectric constant than silicon nitride.

FIGS. 5 through 11 are schematic plan diagrams illustrating a method for forming wire lines and interconnecting contacts according to the embodiments of the present invention.

FIGS. 12 through 22 are schematic cross-sectional diagrams illustrating the method for forming wire lines and interconnecting contacts using a multi-layered hard mask according to some embodiments of the invention.

In the embodiments, a method for forming bit lines and BCs in a COB-type DRAM device will be described with reference to FIGS. 5 through 11 and 12 through 22. However, the inventive concepts illustrated in these embodiments may be likewise applied to semiconductor devices including wire lines and interconnecting contacts formed perpendicular to the wire lines or in between the wire lines.

Figure 5:
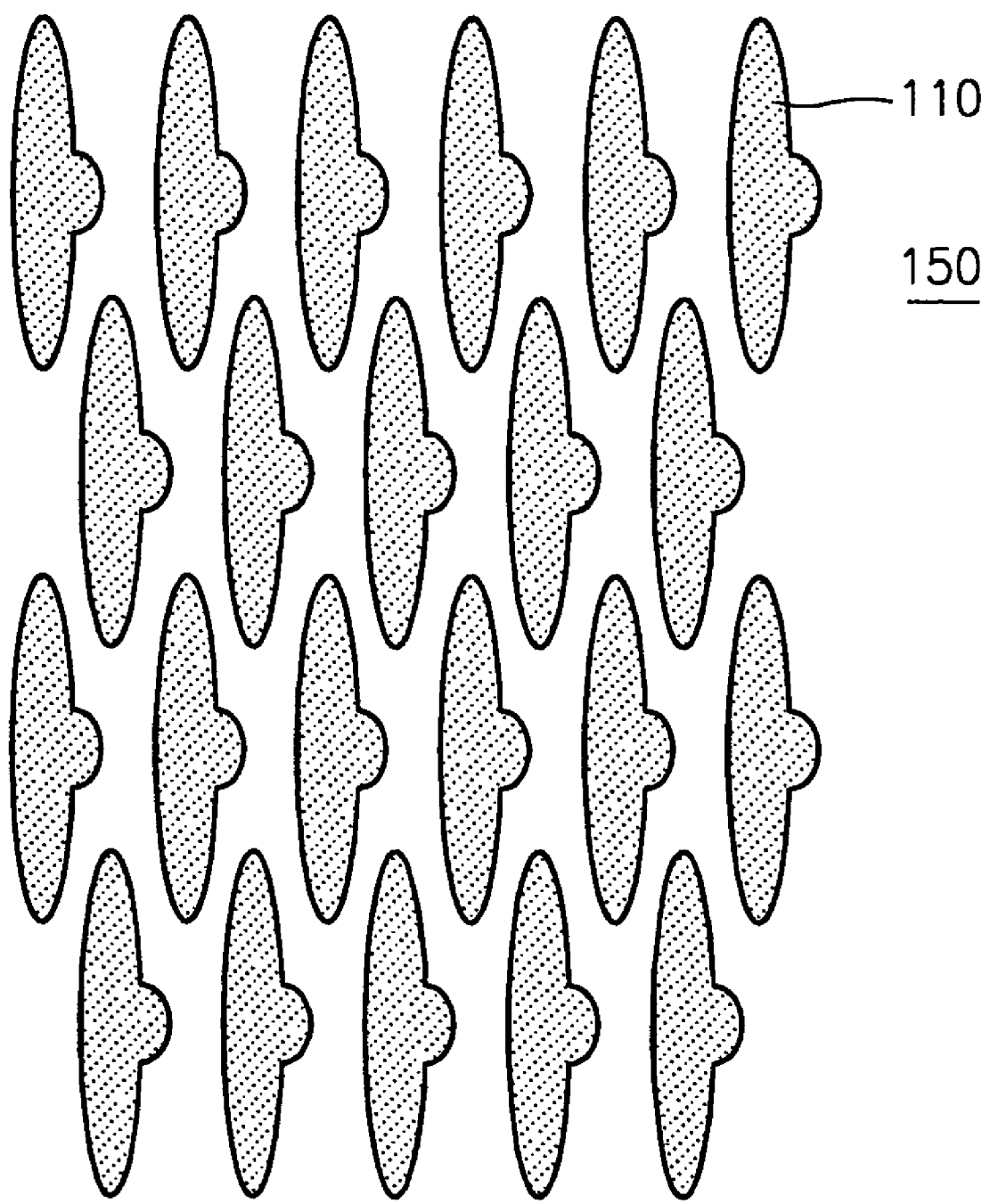
FIGS. 5 through 11 are schematic plan diagrams illustrating a method for forming wire lines and interconnecting contacts according to some embodiments of the invention.

Initially, referring to FIG. 5, an isolation region 150 is formed by an isolation process on a semiconductor substrate to define an active region 110 where devices such as transistors will be formed.

Figure 6:
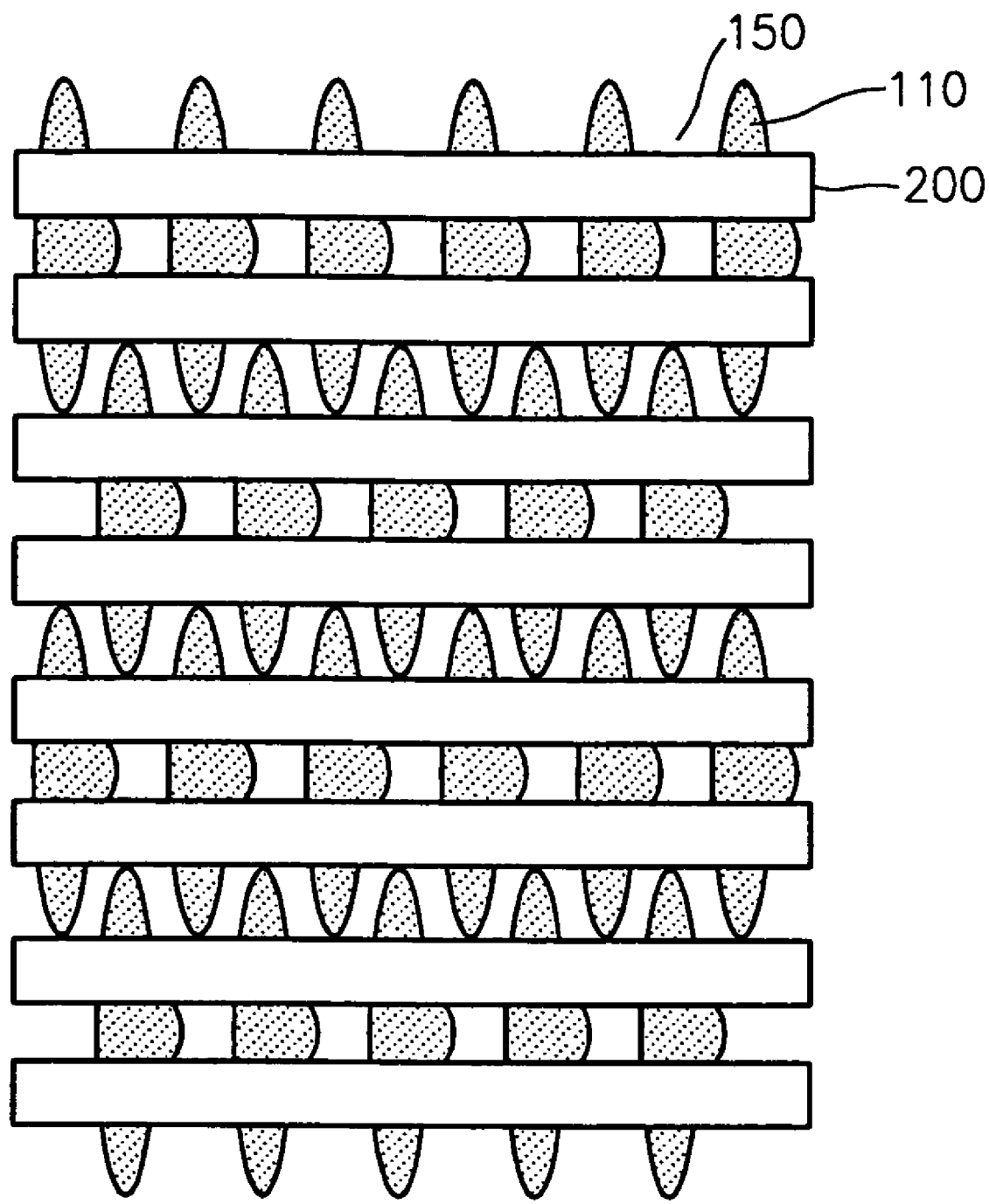

Referring to FIG. 6, gate lines 200 are formed by a gate process to cross over the active region 110. Here, the gate lines 200 are word lines used as gates of transistors and formed of a conductive layer. Also, the gate lines 200 are preferably surrounded by a gate oxide layer, a gate spacer, and a gate capping layer. When the gate spacer and the gate capping layer are formed, a subsequent contact process preferably includes a self-aligned contact (SAC) process. To meet requirements for the reduced design rule, the gate lines 200 are preferably formed of a low-resistance material, such as tungsten (W).

Figure 7:
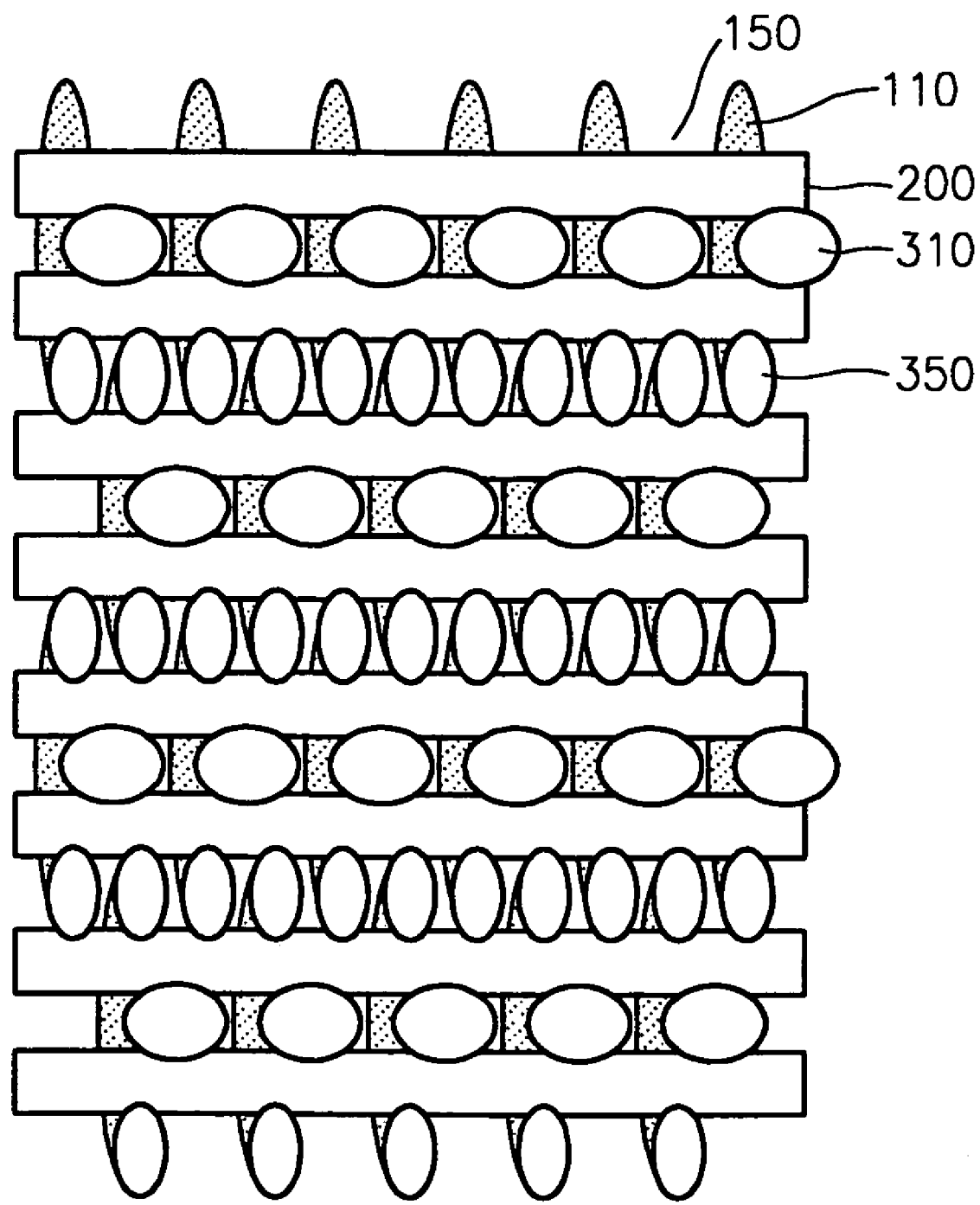
Figure 12:
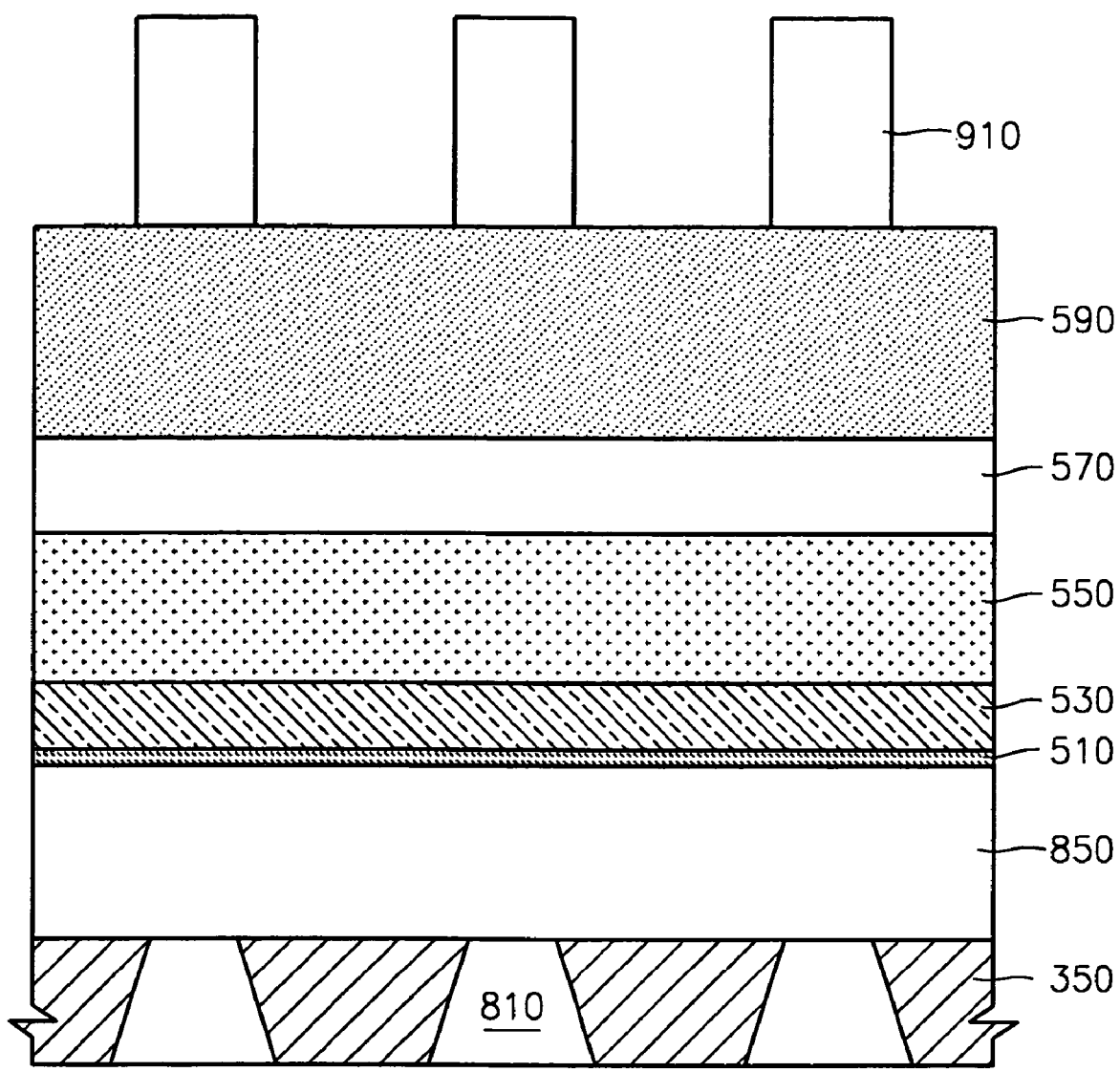

Referring to FIGS. 7 and 12, a first insulating layer (810 of FIG. 12) is formed to cover the gate lines 200, and conductive contact pads 310 and 350 are formed to penetrate the first insulating layer 810 until portions of the semiconductor substrate are exposed. To form the contact pads 310 and 350, contact holes are formed by the SAC process, and a conductive material (e.g., a conductive polysilicon) is deposited to fill the contact holes. Despite the reduced design rule, the conductive contact pads 310 and 350 are helpful in securing sufficient process margins. In a DRAM device, the conductive contact pads 310 and 350 can be divided into first contact pads 310, which electrically connected to the bit lines, and second contact pads 350, which will be electrically connected to capacitors.

Figure 8:
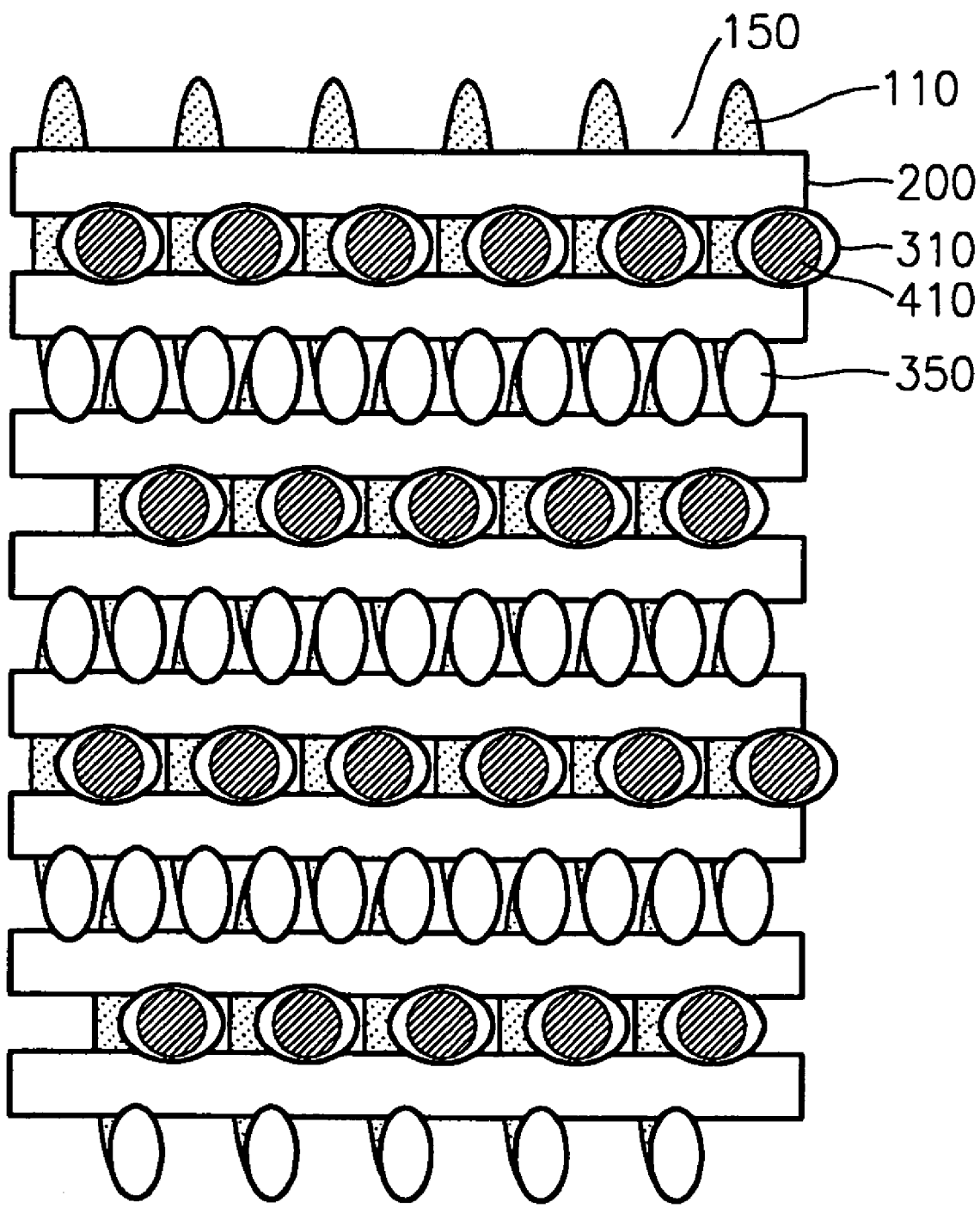

Referring to FIGS. 8 and 12, a second insulating layer 850 is preferably formed using silicon oxide to cover the contact pads 310 and 350. Contact holes are formed to expose the first contact pads 310, and bit line contacts 410 are formed by filling the contact holes with a conductive material layer. The bit line contacts 410, which are interconnecting contacts, are used to electrically connect the active region 110 of the semiconductor substrate with the bit lines through the first contact pads 310. That is, the bit line contacts 410 are used as DCs.

Figure 9:
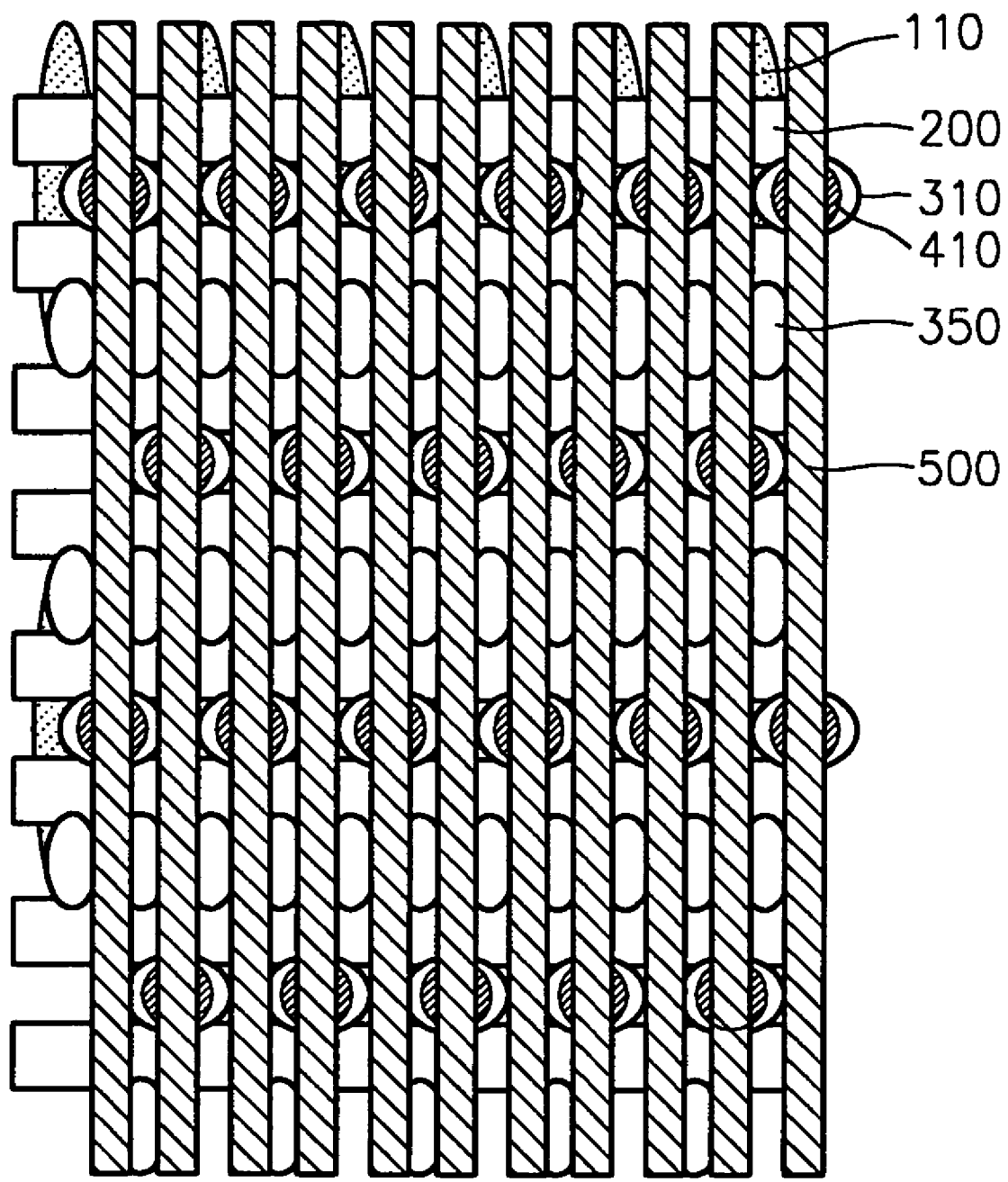

Referring to FIG. 9, bit line stacks 500, which include bit lines connected electrically to the bit line contacts 410, are formed. The formation of the bit line stacks 500 will be described in more detail with reference to FIGS. 12 through 16.

Referring to FIG. 12, a titanium/titanium nitride (Ti/TiN) layer is preferably formed as a barrier layer 510 on the second insulating layer 850, and a tungsten (W) layer is formed as a bit line layer 530 thereon. Thereafter, a multi-layered hard mask layer 550, 570, and 590 for patterning bit lines is formed. For example, a triple hard mask layer including first through third hard mask layers 550, 570, and 590, which are formed of three different materials, is formed.

The first hard mask layer 550 can be formed of an insulating material, for example, silicon nitride, having a sufficient etch selectivity with respect to a third insulating layer formed of silicon oxide, which will fill gaps between the patterned bit lines.

The second hard mask layer 570 is deposited on the first hard mask layer 550 to protect the first hard mask layer 550. In particular, the second hard mask layer 570 can be formed of an insulating material, for example, polysilicon, having a very high etch selectivity with respect to the third insulating layer formed of silicon oxide and also having a sufficient etch selectivity with respect to the first hard mask layer 550. Alternatively, the second hard mask layer 570 may be formed of titanium nitride (TiN) having a high etch selectivity with respect to the silicon oxide.

Thereafter, a third hard mask layer 590 is formed to protect the second hard mask layer 570 during patterning of the bit line layer 530. Also, the third hard mask layer 590 will be used as a substantial etch mask during the patterning of the bit line layer 530. The third hard mask layer 590 is formed of an insulating material, for example, silicon oxide, having a very high etch selectivity with respect to the bit line layer 530 formed of a metal such as tungsten.

The third hard mask layer 590 can be formed to a sufficient thickness of, for example, about 2000 Å to 2500 Å, to protect the second hard mask layer 570 during the patterning of the bit line layer 530. The second hard mask layer 570 can be formed to a sufficient thickness to protect the first hard mask layer 550 while the second contact 350 is being exposed by etching the third insulating layer. For example, polysilicon for the second hard mask layer 570 is formed to a thickness of about 1000 Å. The first hard mask layer 550 formed of silicon nitride can be formed to a thickness of, for example, about 1500 Å to 2000 Å to secure sufficient insulating margins between the BCs and the bit lines.

After the multi-layered hard mask layer 550, 570, and 590 are formed as described above, a first photoresist pattern 910 used for patterning the hard mask layer is formed by a photolithography process.

Referring to FIG. 13, the third hard mask (590 of FIG. 12) is patterned by dry etching using the photoresist pattern (12 of FIG. 12) as an etch mask, thereby forming a third hard mask 591. Thereafter, the first photoresist pattern 910 is removed if necessary.

Referring to FIG. 14, the second hard mask layer (570 of FIG. 13) is patterned by dry etching using the third hard mask 591 as an etch mask, thereby forming a second hard mask 571. Since the third hard mask 591 formed of silicon oxide has a sufficient etch selectivity with respect to the second hard mask layer 570 formed of polysilicon or titanium nitride, the second hard mask 571 can be patterned without a great loss of the third hard mask 591 formed of silicon oxide.

Figure 15:
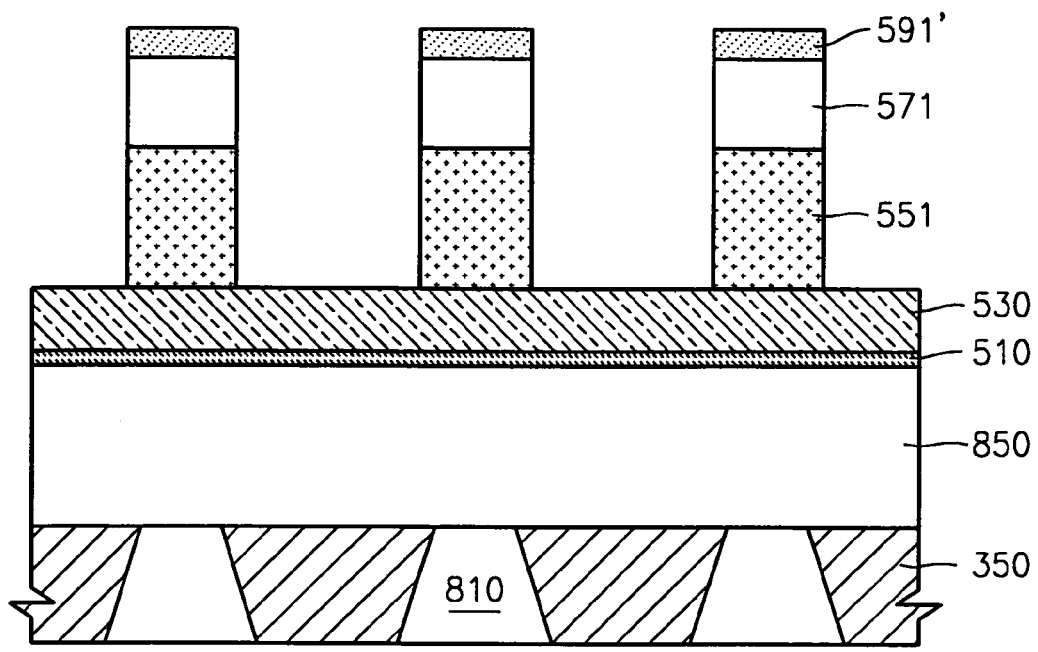

Referring to FIG. 15, the first hard mask layer (550 of FIG. 14) is patterned by dry etching using the third hard mask (591 of FIG. 14) as an etch mask, thereby forming a first hard mask 551. The third hard mask 591 formed of silicon oxide may have an insufficient etch selectivity with respect to the first hard mask 550 formed of silicon nitride. Accordingly, a large amount of third hard mask 591 may be consumed. Nevertheless, the third hard mask 591 of about 2000 Å to 2500 Å thickness preferably remains until the first hard mask 551 is completely patterned from the first hard mask layer 550. That is, a third hard mask 591' of a sufficient thickness can remain on the second hard mask 571 by controlling the thickness of the third hard mask layer (590 of FIG. 12).

Figure 16:
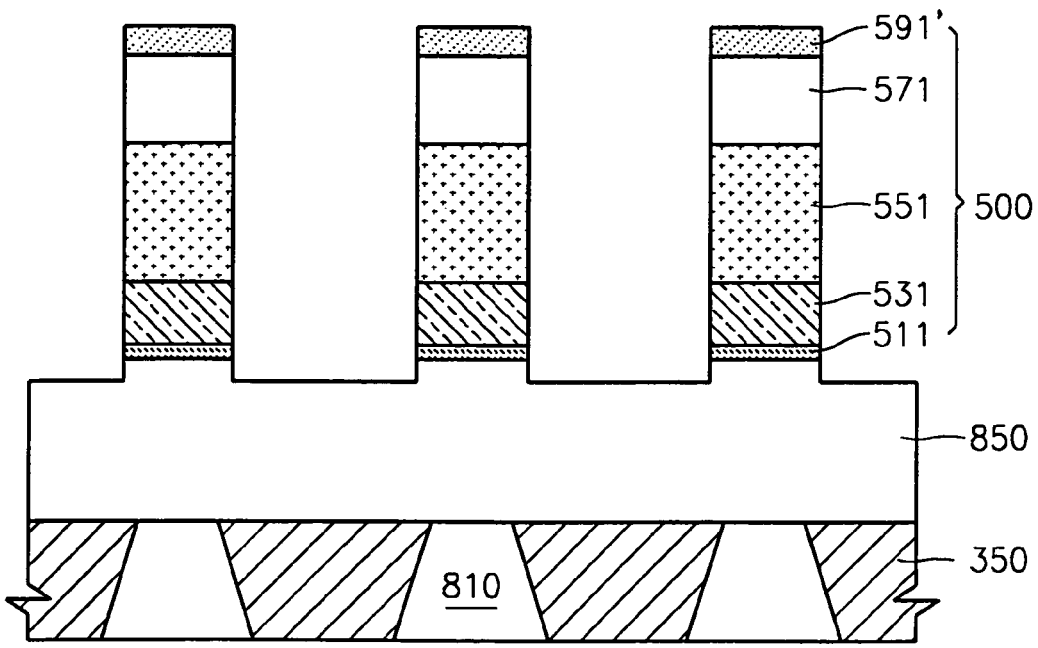

Referring to FIG. 16, the bit line layer (530 of FIG. 15) is patterned by dry etching using the third hard mask 591' as an etch mask, thereby forming bit lines 531. Preferably, over-etching is carried out so as to pattern even the barrier layer 511 disposed under the bit lines 531. Thus, the second insulating layer 850 disposed under the barrier layer 511 may be partially recessed. Since the bit line layer 530 formed of a metal such as tungsten has a sufficient etch selectivity with respect to the third hard mask 591' formed of silicon oxide, it can be selectively etched. Thus, the bit lines 531 can be formed without an enormous loss of the third hard mask 591'.

As described with reference to FIGS. 12 through 16, if the bit lines 531 are patterned using the hard masks 551, 571, and 591', the first hard mask 551 formed of silicon nitride can be effectively protected from etching damage. Thus, it is possible to secure sufficient insulating margins or shoulder margins between the bit lines 531 and BCs to be formed later.

Meanwhile, in the method described with reference to FIGS. 12 through 16, if necessary, by-products such as polymer and defects can be removed using various cleaning processes between the dry etch processes.

Figure 10:
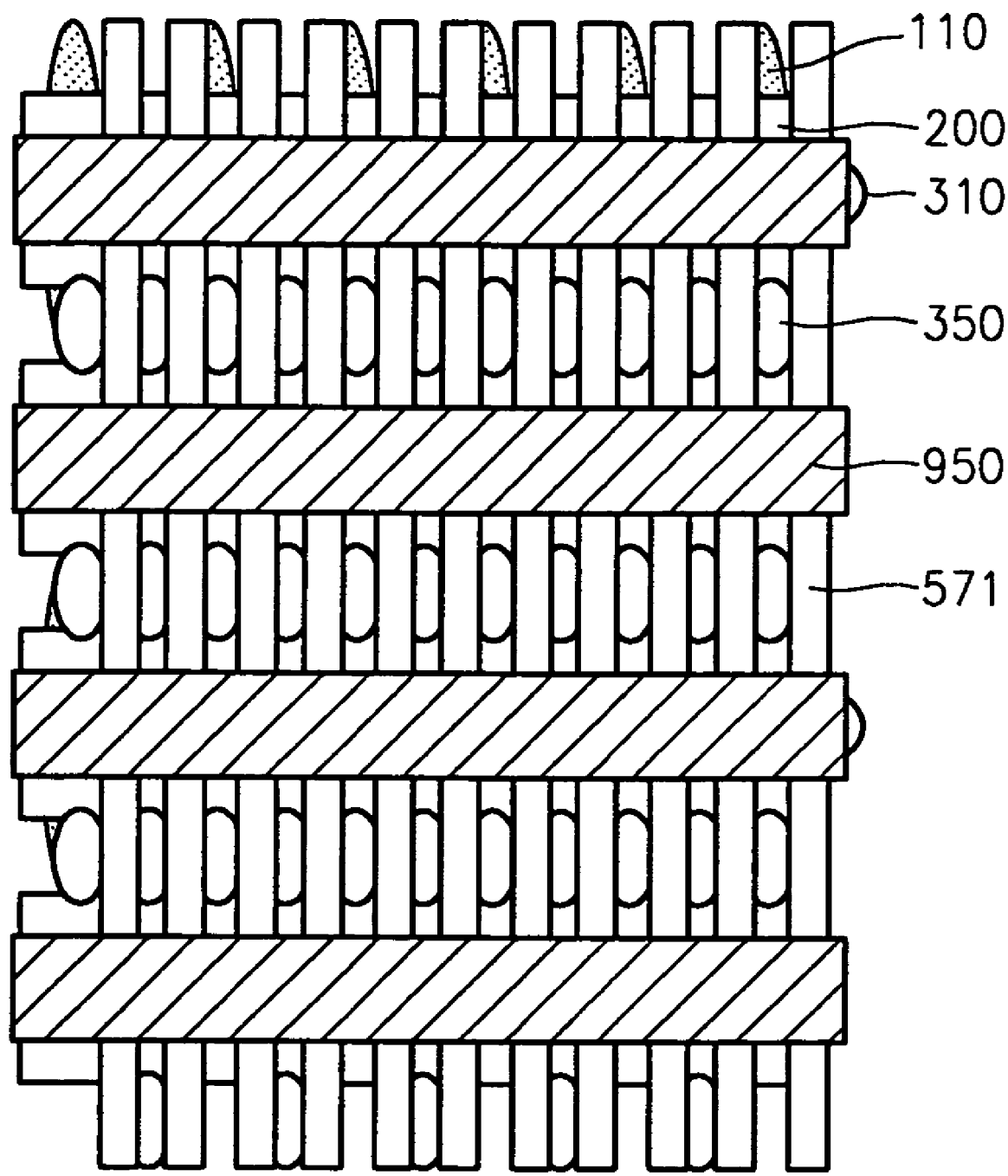
Figure 17:
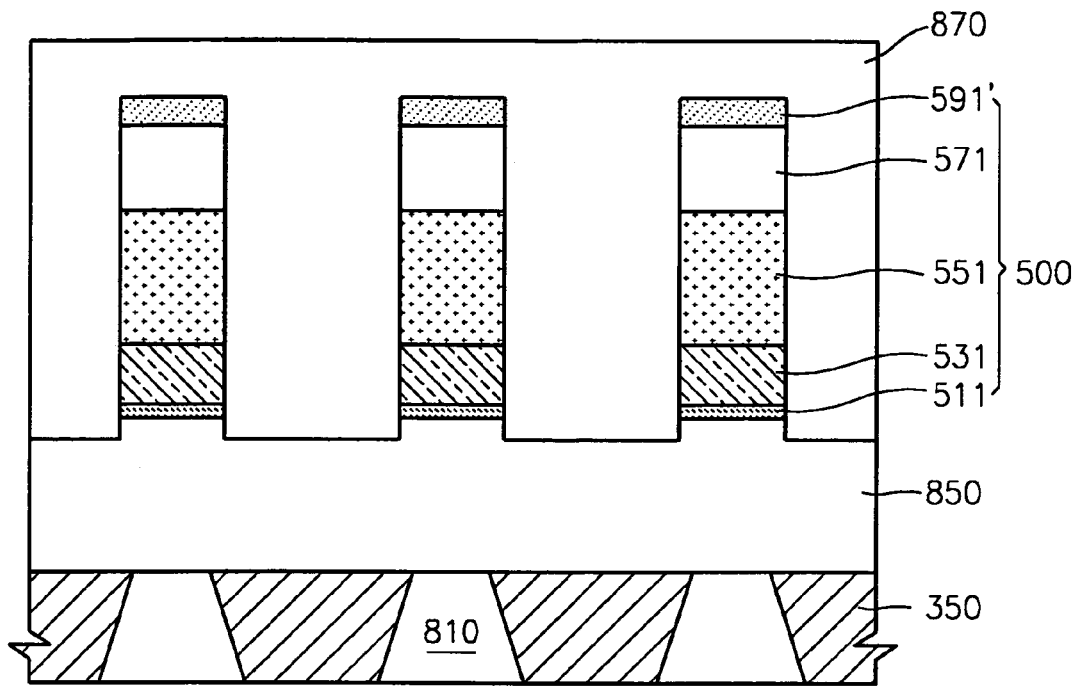

Referring to FIGS. 10 and 17, after the bit line stacks 500 are patterned, a third insulating layer 870 is formed on the remaining third hard mask 591' to cover the bit line stacks 500. The third insulating layer 870 is formed to sufficiently fill gaps between the bit line stacks 500 and is preferably formed of silicon oxide. The top surface of the third insulating layer 870 may be planarized later.

Thereafter, a second photoresist pattern 950 is formed by a photolithography process on the third insulating layer 870. The second photoresist pattern 950 will be used as an etch mask during an etch process for exposing the active region 110 of the semiconductor substrate under the second insulating layer 850, substantially, for exposing the second contact pads 350, as shown in FIG. 17. For example, as shown in FIG. 10, a line-type or bar-type second photoresist pattern 950 is formed in a lengthwise direction of the gate lines (200 of FIG. 8). The second photoresist pattern 950 is formed to expose regions that overlap the second contact pads 350. Also, the second photoresist pattern 950 may not be a line-type photoresist pattern but a typical photoresist pattern used in formation of contact holes.

Figure 1:
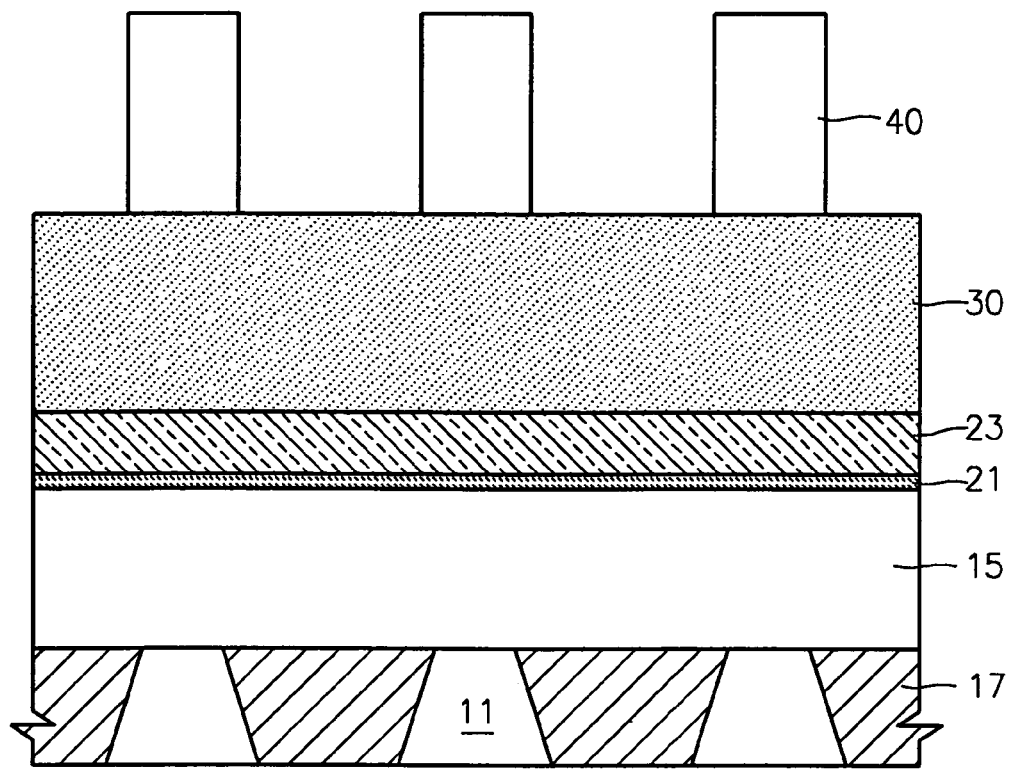
FIGS. 1 through 4 are schematic cross-sectional diagrams illustrating a conventional method for forming wire lines.
Figure 2:
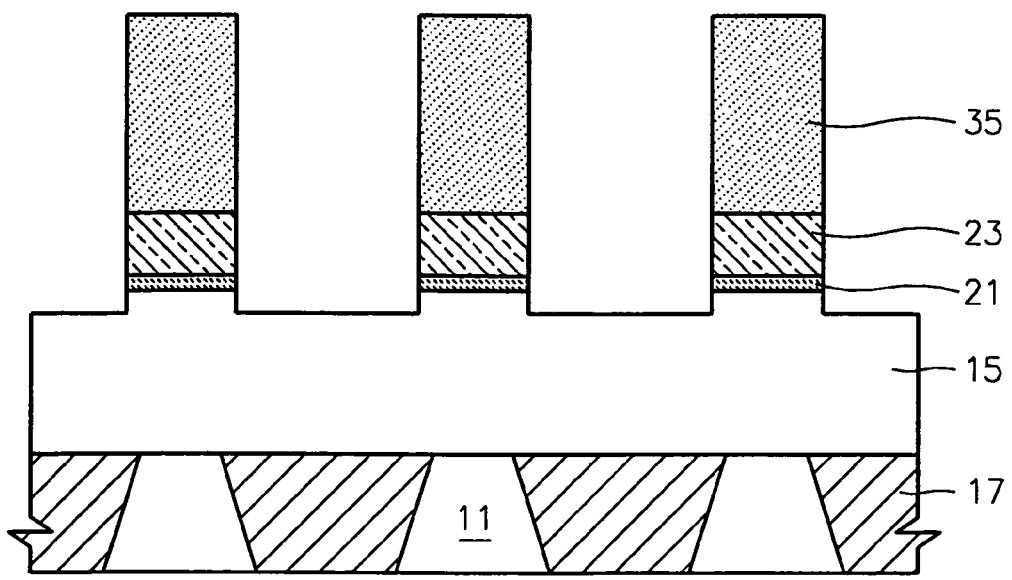
Figure 3:
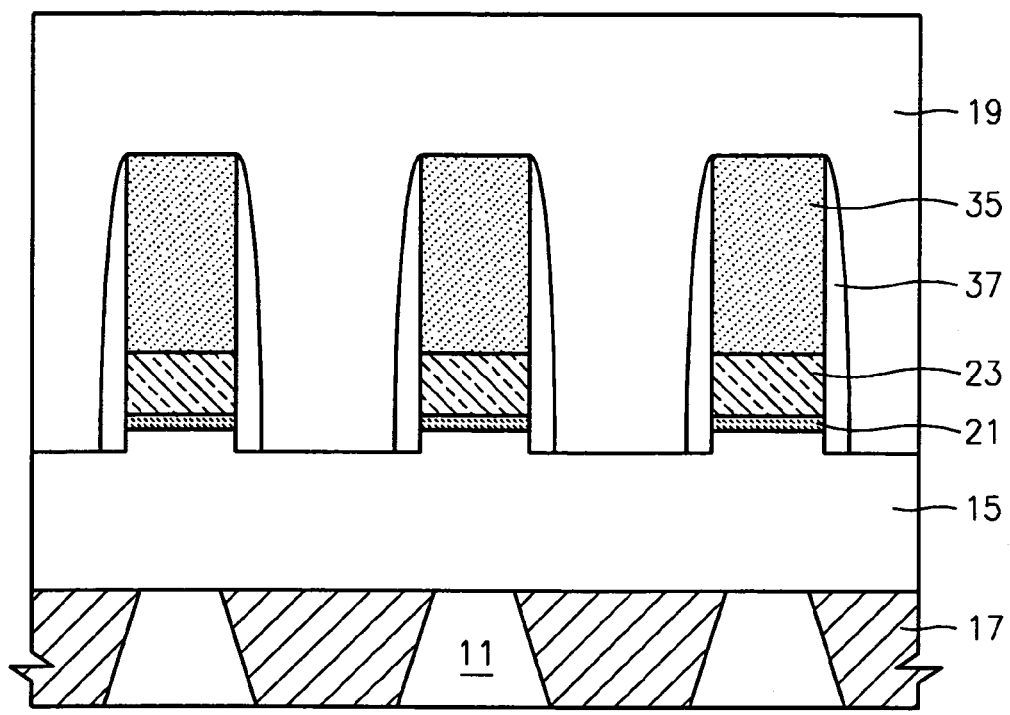
Figure 4:
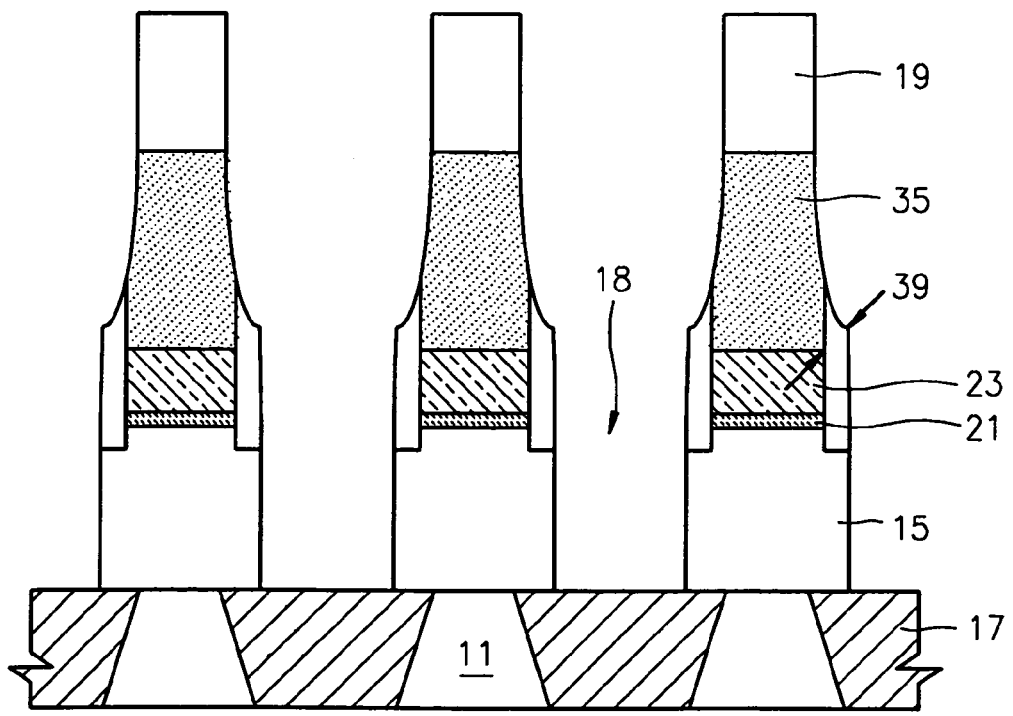
Figure 18:
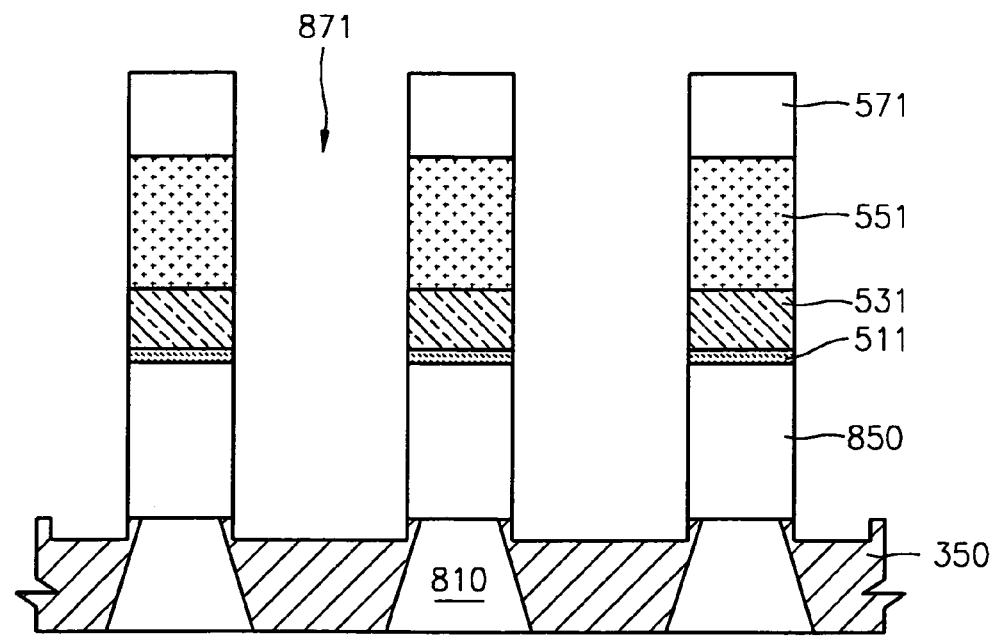

Referring to FIGS. 10 and 18, exposed portions of the third insulating layer 870 are selectively etched and removed using the second photoresist pattern 950 as an etch mask. Also, portions of the second insulating layer 850, which are exposed by etching the portions of the third insulating layer 870, are selectively etched, thereby forming openings 871 exposing the top surfaces of the second contact pads 350. The third insulating layer 870 and the second insulating layer 850, which are formed of silicon oxides, are etched under etching conditions of silicon oxide. Here, since portions of the third hard mask 591', which are exposed by etching, are also formed of silicon oxide, they are selectively etched to expose the second hard mask 571. Since the second hard mask 571 formed of polysilicon or titanium nitride has a very high etch selectivity with respect to silicon oxide, it is not entirely removed by etching of the third and second insulating layers 870 and 850 and still remains. The second hard mask 571 prevents etching damage to the first hard mask 551 formed of silicon nitride during the formation of the openings 871. Accordingly, the narrowing of the insulating margins or shoulder margins 39 of FIG. 4 caused by consumption of silicon nitride can be prevented.

Figure 19:
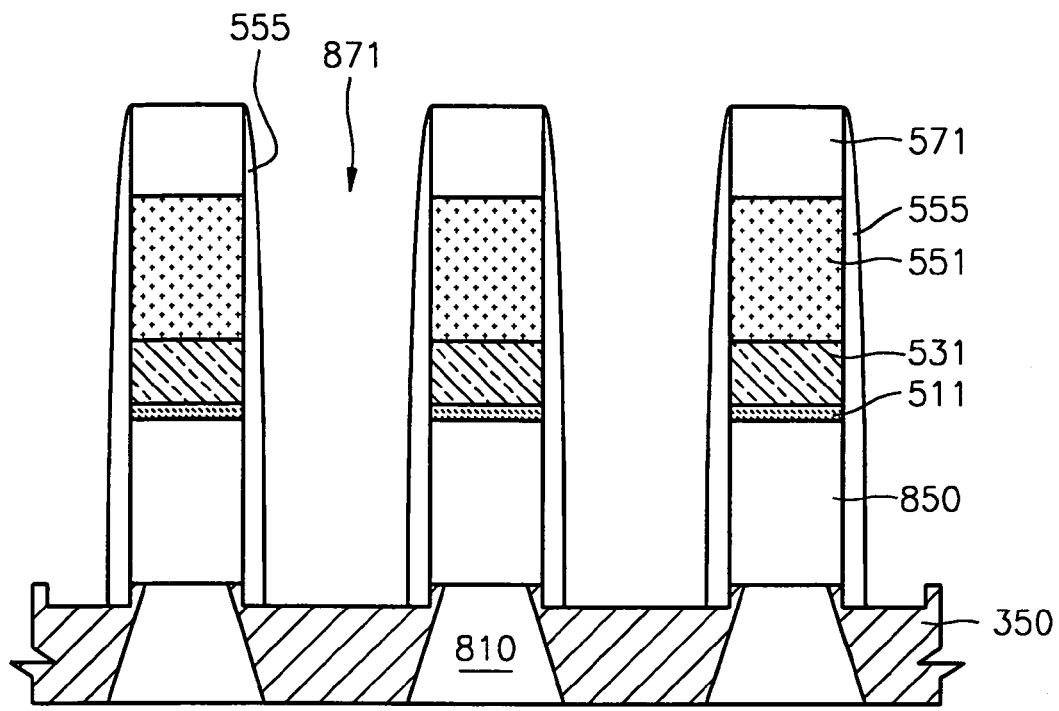

Referring to FIGS. 10 and 19, after the openings 871 are formed, insulating spacers 555 are formed on the sidewalls of the openings 871. The insulating spacers 555 are formed to insulate the sidewalls of the bit lines 531 from capacitor contacts (i.e., BCs), which will fill the openings 871. Although the insulating spacers 555 may be formed of silicon nitride or silicon oxide, it is preferably formed of a relatively low-k dielectric silicon oxide to reduce parasitic capacitance.

Figure 20:
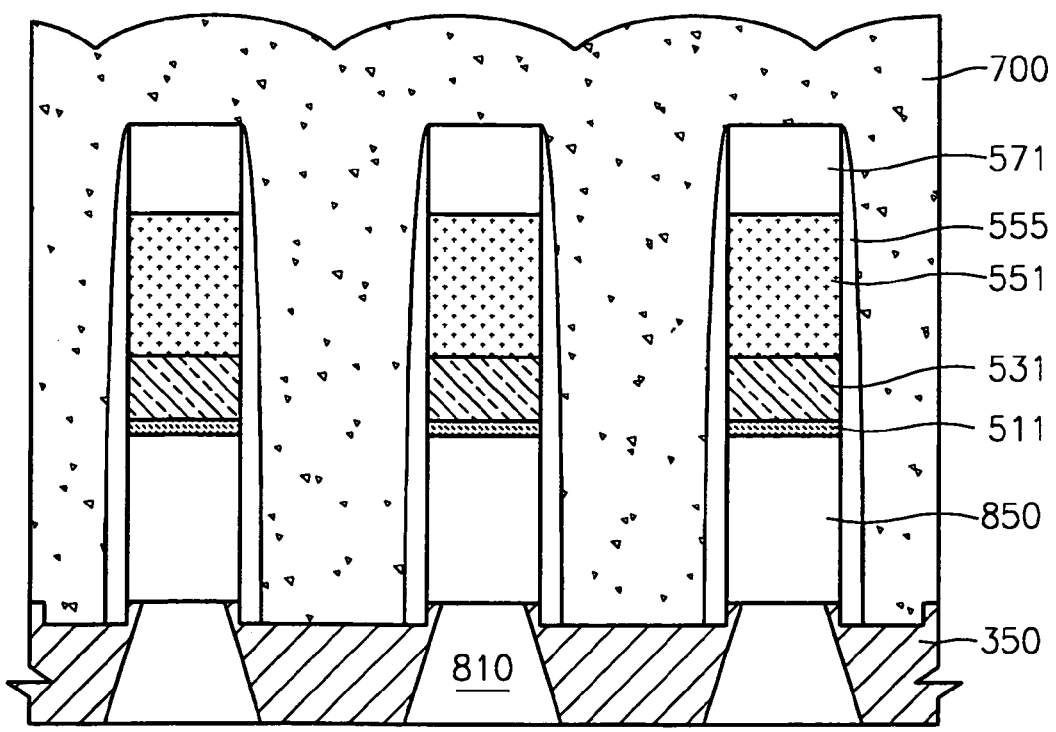

Referring to FIGS. 10 and 20, a conductive layer 700 for contacts such as the BCs is formed to fill the openings (871 of FIG. 19). The conductive layer 700 may be formed of a conductive material, such as conductive polysilicon. Before the conductive layer 700 is formed, a known cleaning process can be carried out to remove a native oxide layer (not shown) and impurities, which may remain on the surfaces of the polysilicon second contact pads 310 exposed by the openings 871.

Figure 11:
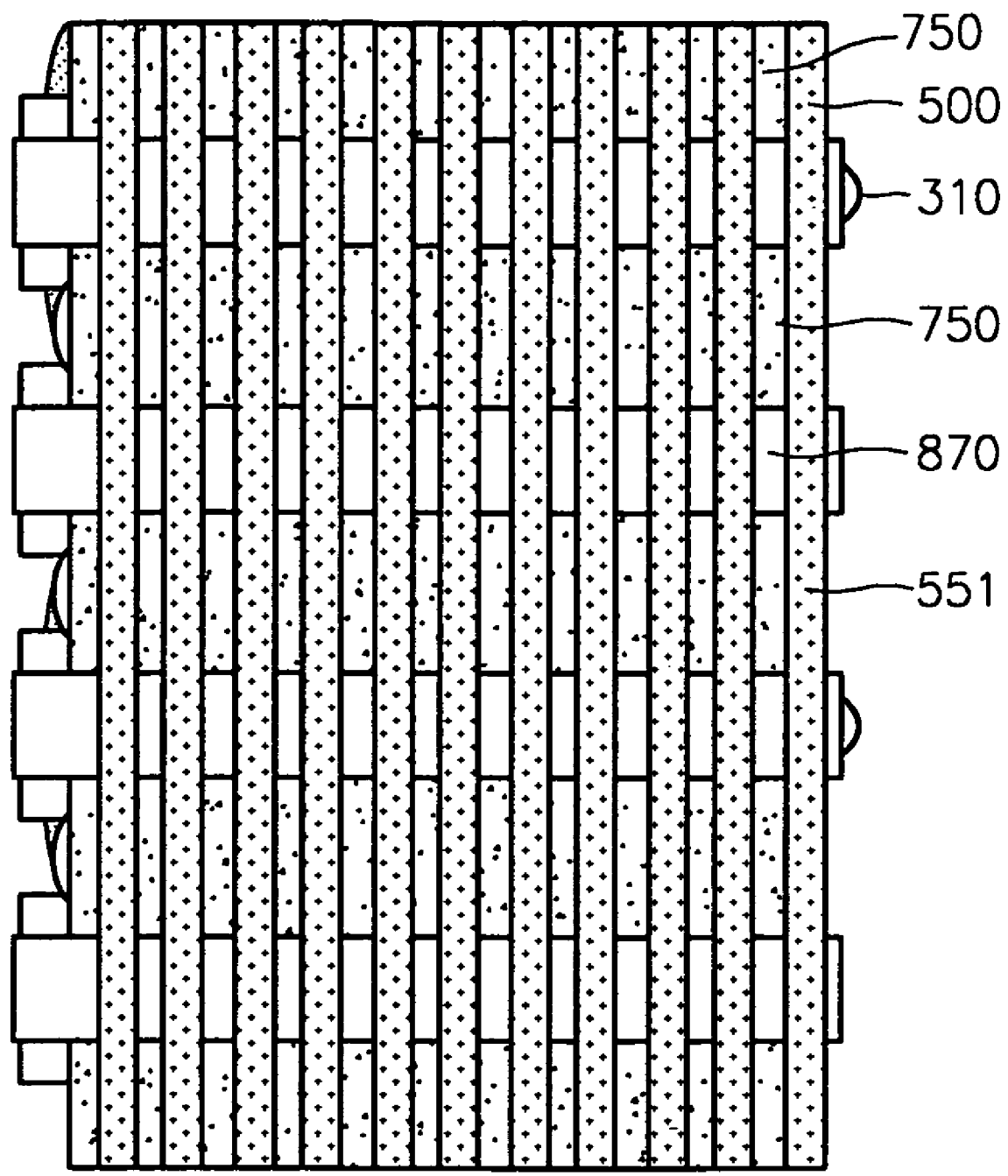
Figure 21:
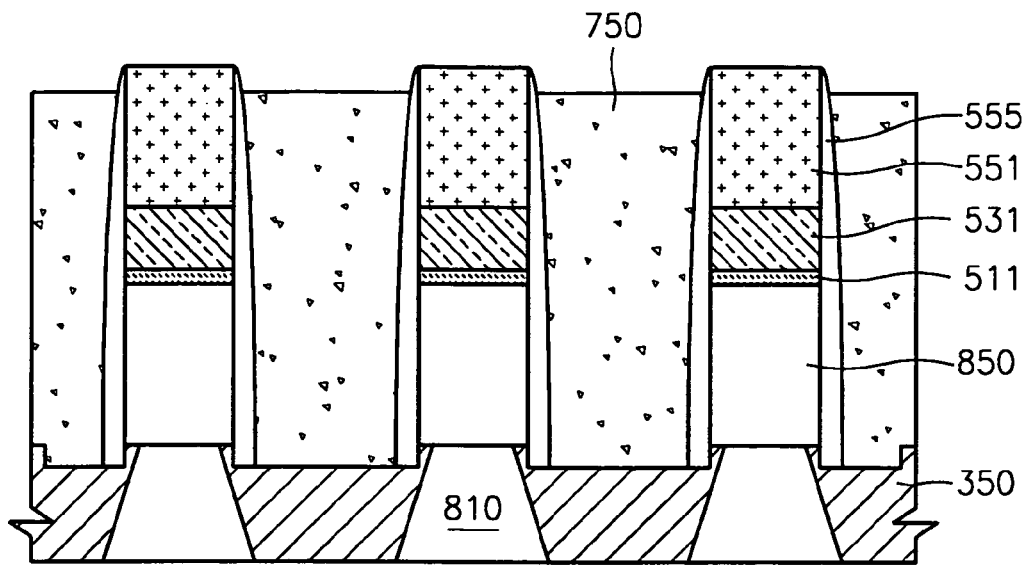

Referring to FIGS. 11 and 21, the conductive layer 700 is node-separated into individual capacitor contacts 750, i.e., BCs. The conductive layer 700 is partially removed using a wet etch process or a chemical mechanical polishing (CMP) process, thereby separating the conductive layer 700 by the openings 871 to form the capacitor contacts 750. The wet etch process may employ a spin processor or may be carried out by dipping the resultant structure in an etchant. Also, the node separation may use a dry etch process. Further, the node separation may use a combination of the wet etch processes, the dry etch process, and the CMP.

In the node separation, the second hard mask 571 formed of polysilicon may be removed together with the conductive layer 700. Also, if the second hard mask 571 is formed of titanium nitride having a very low etch selectivity with respect to polysilicon, the titanium nitride may be removed together with the conductive layer 700.

The etch process of the conductive layer 700, which comprises the node separation and the selective removal of the second mask 571, is carried out using the first hard mask 551 formed of silicon nitride as an etch stopper. Since the silicon nitride has a sufficient etch selectivity with respect to polysilicon, it can be used as an etch stopper. Thus, the surfaces of the capacitor contacts 750 have a slightly lower height than that of the first hard mask 551. Also, the top surface of the first hard mask 551 disposed on the bit lines 531 is exposed by the node separation.

As a result, as shown in FIG. 11, the capacitor contacts 750 are separated from each other in a lengthwise direction of the gate lines 200 by the third insulating layer 870, the second insulating layer 850, and the like, and separated from each other in a lengthwise direction of the bit lines 531 by the insulating spacers 555 and the first hard mask 551, which surround the bit lines 531.

Thereafter, capacitor storage nodes are formed on the capacitor contacts 750 and then subsequent capacitor forming processes are performed. Thus, capacitors, which are electrically connected to the active region 110 of the semiconductor substrate by the capacitor contacts 750 and the second contact pads 350, are completed.

Meanwhile, directly after the bit lines 531 are patterned using the hard masks 551, 571, and 591' as described with reference to FIG. 16, bit line spacers may be additionally formed on the sidewalls of the bit lines 531 if necessary.

Figure 22:
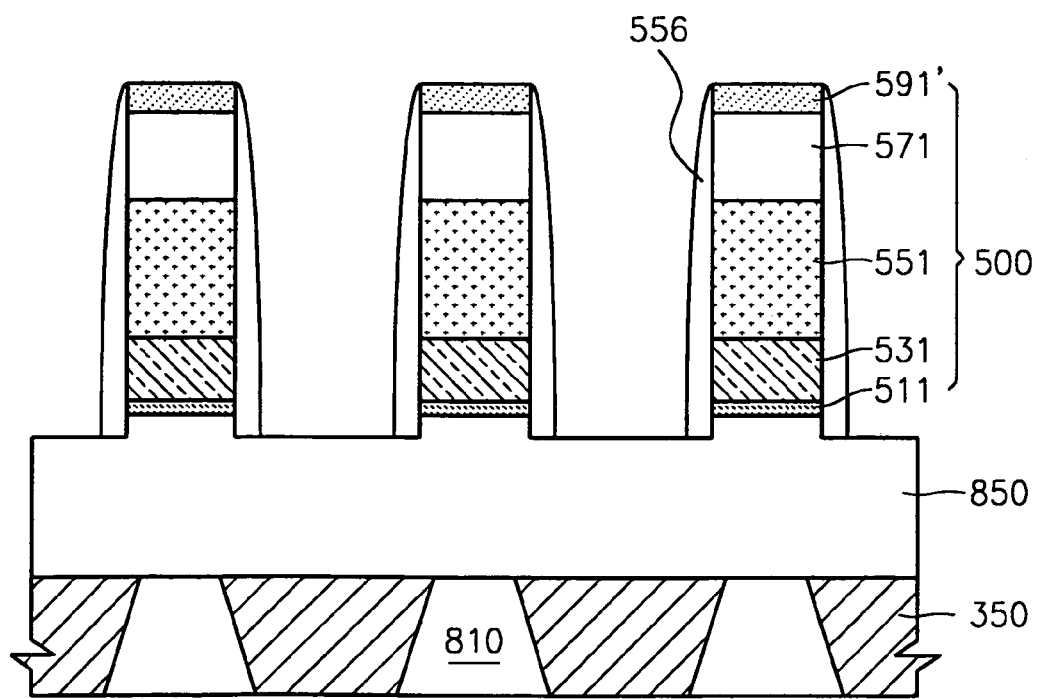

FIG. 22 is a schematic cross-sectional view illustrating formation of bit line spacers 556 after the patterning of the bit lines 531.

Referring to FIG. 22, a protection layer (not shown) for protecting the sidewalls of the bit lines 531 may be formed by depositing an insulating material such as silicon nitride at about several tens of Å to several hundred Å thickness. Also, the resultant protection layer may be etched back to form bit line spacers 556. After the openings (871 of FIG. 18) are formed, portions of the protection layer or the bit line spacers 556, which are exposed by the openings 871, may be removed.

Thus, in some embodiments of the invention, bit lines are formed using a multi-layered hard mask and BC nodes are separated by forming line-type BCs in the same direction of gate lines. Thus, the narrowing of shoulders between the bit lines and the BCs can be prevented, and spacers can be formed of a low k-dielectric silicon oxide, thereby lowering parasitic capacitance.

There are many ways to practice the invention. What follows are descriptions of example, non-limiting, embodiments of the invention.

Some embodiments of the invention provide a method for forming wire lines and interconnecting contacts. After wire lines such as bit lines are patterned, when interconnecting contacts such as capacitor contacts are formed between the bit lines to be electrically connected to a semiconductor substrate, sufficient insulating margins can be secured between the interconnecting contacts and the bit lines. Thus, the method allows excellent insulating characteristics between the wire lines and the interconnecting contacts. Also, parasitic capacitance between the bit lines may be minimized without using silicon nitride to form insulating material layers (e.g., spacers) required for insulation between the bit lines.

In accordance with some embodiments of the invention, there is provided a method for forming wire lines and interconnecting contacts, the method including forming a wire line layer used for operations of a device; forming a multi-layered hard mask on the wire line layer, the multi-layered hard mask including at least a first hard mask, a second hard mask, and a third hard mask, which are formed of different insulating materials to have an etch selectivity with respect to each other; forming wire lines by patterning the wire line layer using the multi-layered hard mask; forming an insulating layer to fill gaps between the wire lines; and forming interconnecting contacts to be aligned with the wire lines and vertically penetrate the insulating layer where the first hard mask is protected by the second hard mask.

In accordance with some embodiments of the invention, there is provided a method for forming wire lines and interconnecting contacts, the method including forming a wire line layer required for operations of a device; forming a multi-layered hard mask on the wire line layer, the multi-layered hard mask including at least a first hard mask, a second hard mask, and a third hard mask, which are formed of different insulating materials to have an etch selectivity with respect to each other; forming wire lines by patterning the wire line layer using the multi-layered hard mask; forming an insulating layer to fill gaps between the wire lines; forming openings to be aligned with the wire lines and vertically penetrate the insulating layer where the first hard mask disposed on the wire lines is protected by the second hard mask; forming insulating spacers on the sidewalls of the openings; forming a conductive layer to fill the openings; and forming interconnecting contacts filling the openings by node-separating the conductive layer.

In accordance with some embodiments of the invention, there is provided a method for forming wire lines and interconnecting contacts, the method including forming a bit line layer on a first insulating layer; forming a multi-layered hard mask on the bit line layer, the multi-layered hard mask including at least a first hard mask, a second hard mask, and a third hard mask, which are formed of different insulating materials to have an etch selectivity with respect to each other; forming bit lines by patterning the bit line layer using the third hard mask as a substantial etch mask; forming a second insulating layer on the third hard mask to fill gaps between the bit lines; forming openings to be aligned with the bit lines and vertically penetrate the second insulating layer and the first insulating layer where the first hard mask disposed on the bit lines is protected by the second hard mask; forming insulating spacers on the sidewalls of the openings; forming a conductive layer to fill the openings; and forming interconnecting contacts filling the openings by node-separating the conductive layer.

Herein, the bit line may be formed of tungsten, and a barrier layer including a titanium/titanium nitride layer may be further formed under the bit line layer.

The formation of the multi-layered hard mask includes sequentially forming a first hard mask layer, a second hard mask layer, and a third hard mask layer on the bit line layer; forming the third hard mask by patterning the third hard mask layer; and patterning the second hard mask layer and the first hard mask layer by using the third hard mask as an etch mask.

The first hard mask layer may be formed to a thinner thickness than the third hard mask layer. The first hard mask layer may be formed of silicon nitride, and the third hard mask layer may be formed of silicon oxide. The second hard mask layer may be formed of at least an insulating material, for example, polysilicon and titanium nitride, having an etch selectivity with respect to the second insulating layer.

The formation of the openings includes forming a bar-type photoresist pattern on the second insulating layer to intersect the bit lines or forming a photoresist pattern on the second insulating layer to have circular exposed portions such that the openings are formed to be circular; and selectively etching exposed portions of the second insulating layer by using the photoresist pattern as an etch mask.

The insulating spacer may be formed of silicon oxide. The conductive layer may be formed of conductive polysilicon.

The formation of the interconnecting contacts includes removing the second hard mask by using the first hard mask as an etch stopper and node-separating the conductive layer using etching. The etching for node-separation may use a spin processor or chemical mechanical polishing.

The wire line layer is a bit line layer, and the interconnecting contacts are capacitor contacts that will be electrically connected to capacitors to be formed over the bit lines.

According to embodiments of the invention, after a wire line layer such as a bit line layer is patterned, when interconnecting contacts such as capacitor contacts are formed between bit lines to be electrically connected to a semiconductor substrate, a sufficient insulating margin between the interconnecting contacts and the bit lines can be secured. Also, since spacers or an insulating material layer formed on the sidewalls of the bit lines may not be formed of silicon nitride, parasitic capacitance between the bit lines can be minimized.

While the invention has been particularly shown and described with reference to preferred embodiments thereof, it will be understood by those of ordinary skill in the art that various changes in form and details may be made therein without departing from the spirit and scope of the invention as defined by the following claims.

I claim:

1. A method for forming wire lines and interconnecting contacts, the method comprising;
    depositing a wire line layer, wherein depositing the wire line layer comprises depositing a metal layer consisting of a metal over a plurality of buried contact pads;
    depositing a multi-layered hard mask layer on the wire line layer, the multi-layered hard mask layer including at least a first hard mask layer, a second hard mask layer, and a third hard mask layer, each of the first, second, and third hard mask layers formed of different insulating materials to have an etch selectivity with respect to each other;
    patterning the multi-layered hard mask layer using a photoresist pattern to produce a multi-layered hard mask;
    patterning the wire line layer using the multi-layered hard mask to form bit lines;
    filling gaps between the wire lines with an insulating layer; and
    forming interconnecting contacts that align with the wire lines and vertically penetrate the insulating layer where the first hard mask is protected by the second hard mask.

2. The method of claim 1, wherein forming the interconnecting contacts comprises forming capacitor contacts configured to electrically connect the device and capacitors to be formed over the bit lines.

3. The method of claim 1, wherein the second hard mask comprises an insulating material having an etch selectivity with respect to the insulating layer.

4. A method for forming wire lines and interconnecting contacts, the method comprising:
    forming a metal layer, the metal layer consisting of a metal;
    forming a multi-layered hard mask on the metal layer, the multi-layered hard mask including at least a first hard mask, a second hard mask, and a third hard mask, which are formed of different insulating materials to have an etch selectivity with respect to each other;
    forming wire lines by patterning the metal layer using the multi-layered hard mask;
    forming an insulating layer to fill gaps between the wire lines;
    forming openings to be aligned with the wire lines and vertically penetrate the insulating layer where the first hard mask disposed on the wire lines is protected by the second hard mask;
    forming insulating spacers on the sidewalls of the openings;
    forming a conductive layer to fill the openings; and
    forming interconnecting contacts that electrically connect the wire line layer to an active region of a semiconductor substrate by filling the openings and by node-separating the conductive layer.

5. The method of claim 4, wherein forming the metal layer comprises forming the metal layer over a plurality of buried contact pads, wherein forming the wire lines comprises forming bit lines, and wherein the second hard mask comprises an insulating material having an etch selectivity with respect to the insulating layer.

6. A method for forming wire lines and interconnecting contacts, the method comprising:
    forming a metal layer on a first insulating layer that covers a plurality of buried contact pads;
    forming a multi-layered hard mask on the metal layer, the multi-layered hard mask including at least a first hard mask, a second hard mask, and a third hard mask, each of which are formed of different insulating materials to have an etch selectivity with respect to each other;
    patterning the metal layer using the third hard mask as an etch mask to form bit lines;
    forming a second insulating layer on the third hard mask to fill gaps between the bit lines;
    forming openings to be aligned with the bit lines and vertically penetrate the second insulating layer and the first insulating layer where the first hard mask disposed on the bit lines is protected by the second hard mask;
    forming insulating spacers on the sidewalls of the openings;
    forming a conductive layer to fill the openings; and
    forming interconnecting contacts filling the openings by node-separating the conductive layer.

7. The method of claim 6, wherein forming the metal layer comprises forming a metal layer consisting of tungsten.

8. The method of claim 6, further comprising forming a barrier layer including a titanium/titanium nitride layer under the metal layer.

9. The method of claim 6, wherein forming the multi-layered hard mask comprises:
    sequentially forming a first hard mask layer, a second hard mask layer, and a third hard mask layer on the metal layer;
    forming the third hard mask by patterning the third hard mask layer; and
    patterning the second hard mask layer and the first hard mask layer by using the third hard mask as an etch mask.

10. The method of claim 6, wherein the first hard mask layer is formed to a thinner thickness than the third hard mask layer.

11. The method of claim 10, wherein the first hard mask layer is formed of silicon nitride.

12. The method of claim 10, wherein the third hard mask layer is formed of silicon oxide.

13. The method of claim 6, wherein the second hard mask layer comprises an insulating material having an etch selectivity with respect to the second insulating layer.

14. The method of claim 13, wherein the second hard mask layer is formed of one of polysilicon and titanium nitride.

15. The method of claim 6, wherein forming openings comprises:
    forming a bar-type photoresist pattern on the second insulating layer to intersect the bit lines or forming a photoresist pattern on the second insulating layer to have circular exposed portions such that the openings are formed to be circular; and
    selectively etching exposed portions of the second insulating layer by using the photoresist pattern as an etch mask.

16. The method of claim 6, wherein the insulating spacer is formed of silicon oxide.

17. The method of claim 6, wherein the conductive layer is formed of conductive polysilicon.

18. The method of claim 6, wherein forming interconnecting contacts comprises:
    removing the second hard mask by using the first hard mask as an etch stopper; and
    node-separating the conductive layer using etching.

19. The method of claim 18, wherein node-separating the conductive layer using etching comprises one chosen from the group consisting of spin processing and chemical mechanical polishing.

20. The method of claim 6, wherein the interconnecting contacts are capacitor contacts configured to be electrically connected to capacitors formed over the bit lines.

* * * * *